US006590635B2

United States Patent
Gelbart

(10) Patent No.: US 6,590,635 B2
(45) Date of Patent: *Jul. 8, 2003

(54) HIGH RESOLUTION OPTICAL STEPPER

(75) Inventor: Daniel Gelbart, Burnaby (CA)

(73) Assignee: Creo Inc., Burnaby (CA)

( * ) Notice: Subject to any disclaimer, the term of this patent is extended or adjusted under 35 U.S.C. 154(b) by 112 days.

This patent is subject to a terminal disclaimer.

(21) Appl. No.: 09/795,146

(22) Filed: Mar. 1, 2001

(65) Prior Publication Data

US 2001/0006414 A1 Jul. 5, 2001

Related U.S. Application Data

(60) Continuation-in-part of application No. 09/689,883, filed on Oct. 13, 2000, which is a division of application No. 09/110,378, filed on Jun. 19, 1998, now abandoned.

(51) Int. Cl.⁷ ........................ G03B 27/42; G02F 1/1335; G03C 5/00
(52) U.S. Cl. ................ 355/53; 349/4; 430/311
(58) Field of Search ................ 355/35, 47, 53, 355/67, 71; 430/4, 5, 302, 311, 316; 349/2, 4

(56) References Cited

U.S. PATENT DOCUMENTS

| | | | |
|---|---|---|---|
| 3,630,732 A | 12/1971 | Gravenwezel et al. | 96/27 |
| 4,619,894 A | 10/1986 | Bozler et al. | 430/942 |
| 4,796,038 A | 1/1989 | Allen et al. | 354/4 |
| 5,001,038 A | 3/1991 | Dorinski et al. | 430/311 |
| 5,132,723 A | 7/1992 | Gelbart | 355/40 |
| 5,182,188 A | 1/1993 | Cole, Jr. et al. | 430/323 |
| 5,298,761 A | 3/1994 | Aoki et al. | 250/548 |
| 5,328,811 A | 7/1994 | Brestel | 430/325 |
| 5,461,455 A | 10/1995 | Coteus et al. | 355/43 |
| 5,512,418 A | 4/1996 | Ma | 430/271.1 |
| 5,631,112 A | 5/1997 | Tsai et al. | 430/22 |
| 5,641,608 A | 6/1997 | Grunwald et al. | 430/302 |
| 5,739,898 A | 4/1998 | Ozawa et al. | 355/53 |
| 5,742,362 A | 4/1998 | Chikamichi | 349/2 |
| 5,777,724 A | 7/1998 | Suzuki | 355/68 |
| 5,795,686 A | 8/1998 | Takizawa et al. | 430/5 |
| 5,847,812 A | 12/1998 | Ooki et al. | 355/67 |
| 5,851,707 A | 12/1998 | Shibuya et al. | 430/5 |
| 6,136,509 A | * 10/2000 | Gelbart | 430/311 |

OTHER PUBLICATIONS

Ooki et al. *Experimental Study on Non-linear Multiple Exposure Method.* SPIE vol. 3051, pp. 85–93 [date unknown].

Neisser et al. *Simulation and Experimental Evaluation of Double Exposure Techniques.* SPIE vol. 3334, pp. 372–377. [date unknown].

* cited by examiner

*Primary Examiner*—Rodney Fuller
(74) *Attorney, Agent, or Firm*—Oyen Wiggs Green Mutala

(57) ABSTRACT

A stepper for imaging integrated circuit and flat panel displays uses a thermoresist instead of photoresist and separates the mask into multiple masks, each one containing only part of the features which need to be imaged. The final image is generated by combining the images from all the masks on a single die taking advantage of the fact that thermal resists do not follow the reciprocity law. For maximum resolution each one of the multiple masks contains features of only one size.

32 Claims, 6 Drawing Sheets

HIGH RESOLUTION OPTICAL STEPPER

This application is a continuation-in-part of Ser. No. 09/689,883 filed Oct. 13, 2000 and entitled HIGH RESOLUTION OPTICAL STEPPER which is a divisional of Ser. No. 09/110,378 filed on Jun. 19, 1998, now abandoned and entitled HIGH RESOLUTION OPTICAL STEPPER.

The subject matter of this application is related to the subject matter of co-pending and commonly owned application Ser. No. 09/093,854 entitled METHOD OF EXPOSING THERMORESIST.

FIELD OF THE INVENTION

The invention relates to imaging of etch resistant layers, also known as "resists". The resists may be used in the fabrication of high resolution patterns by etching or deposition. The invention has particular application in the manufacturing of integrated circuits, flat panel displays and the like using an optical stepper. A stepper is an imaging device used in the semiconductor industry to project an image of a mask onto a semiconductor wafer.

BACKGROUND OF THE INVENTION

The process of fabricating high resolution patterns, mainly on planar objects, by selective etching or deposition has been well known for centuries. In general, the layer to be shaped or patterned is covered by a protective layer known as a "resist". Desired shapes are created in the protective layer, usually via photo-imaging. The exposed (or unexposed, if the resist is negative working) part of the image is removed, normally by using a liquid developer to expose the layer underneath. The most common resists operate by a change of solubility in a developer. The exposed layer can now be etched through the openings in the resist layer, which protects the covered area from the etching process. Etching can be by wet chemicals or by dry plasma (a process widely used in the semiconductor industry).

Instead of etching an additive process can be used. In an additive process a material is deposited through the openings in a resist to add to the layer underneath the resist. This deposition can be done in a wet process (as in the well known "additive" process for manufacturing printed circuit boards) or in a dry process, such as a vacuum deposition by evaporation or sputtering. Another way of using a resist is in allowing chemical reactions, such as oxidation, to occur only in the areas not covered by the resist. At the end of the process, any remaining resist is normally removed, or "stripped".

In general, a resist is an imagewise mask selectively controlling a chemical or physical process and limiting the process to follow the image pattern. The term "resist" should be interpreted in this broad sense throughout this disclosure and claims. Any other layer which has suitable properties and can be patterned by light or heat can be used as a resist. Historically most resists were photoresists, i.e. activated and imaged by the photonic action of light. Because of this photonic action most photoresists operate in the UV part of the spectrum, where the photon energy is high. Some resists are exposed by other types of radiation, such as electron-beams. All photoresists and electron beam resists share one fundamental property: they respond to the total exposure, not to the momentary illumination. In optics, exposure is defined as the integral of illumination over time. For example, a photoresist can be exposed by 100 mW/cm$^2$ for 1 sec to yield an exposure of 100 mJ/cm$^2$ (100 mw×1 sec) or it can be exposed by 1000 mW for 0.1 sec (100 mW×0.1 sec=100 mW/cm$^2$) to yield similar results. This law is also known as the "reciprocity law" and it is the basic law governing the exposure of photoresists. When a certain exposure is reached, a change occurs in the resist. Since exposure is a linear function of power and time, the principles of linear superposition apply.

The law of reciprocity requires that optical systems used to expose photoresists and electron beam resists provide a high contrast ratio and low stray light. For example, if an exposure system has a light leakage, or stray light, of 1% (i.e.: when exposure is "off", the light level does not drop to zero but only to 1% of the "on" state) the effect of the stray light can be as large (or larger) than the main exposure if the photoresist is illuminated by the stray light for a long time.

An even larger problem is caused when trying to image high resolution features: the point spread function of the optical system causes a "spreading" of light from each feature. This causes light which is intended to expose one feature to overlap with adjacent features. This lowers resolution. This problem is most severe in the semiconductor industry when using steppers to image a semiconductor wafer, typically a silicon wafer.

Most integrated circuits today are fabricated using selective etching or deposition according to a master pattern known as a mask. An imaging device known as a stepper is used to image the mask onto a resist on a substrate. Steppers are also known as "step and repeat production aligners". Steppers typically include sophisticated programmable controllers capable of coordinating the selection and positioning of masks and the exposures of resists through the selected mask.

The basic elements of a stepper are shown in FIG. 1, where a mask 1, containing a pattern which is to be imaged onto silicon wafer 4 is illuminated by light source 2. Mask 1 is imaged with a reduction lens 3 to form image 5, typically at a 5× reduction. Wafer 4 is stepped by x-y positioning system 6 and 7. Each of a number of areas on wafer 4 is exposed with the pattern of mask 1. A controller 20 coordinates the operation of x-y positioners 6, 7 and light source 2 to image mask 1 onto wafer 4 at one or more locations. The exposed areas are known as dies. Typically wafer 4 is coated with photoresist before exposure, however in some cases a different layer which is capable of responding to light is used. Because of the extremely fine features (below 1 micron) in image 5 which are typically imaged on each die, lens 3 is not capable of fully resolving all detail without some distortion of features.

If a cross section of the image of the mask 1 is taken along line 8 it would look like graph 9 in FIG. 2. If a cross section of the same image is taken at the surface of the wafer 4 along the line 8' (FIG. 1) it would look like graph 10 in FIG. 2. For further details on microlithography in general, and operation of steppers in particular, any modern book on the subject can be consulted, such as: "Handbook of Microlithography, Micromachining and Microfabrication", Volumes 1 and 2, Edited by P. Rai-Choudhury, SPIE Press 1997, ISBN book number 0-8194-2378-5 (V.1) and 0-8194-2379-3 (V.2).

Referring now to FIG. 2, mask 1 is transmits light in all of its non-opaque areas. The transmitted light forms an image on the resist-covered surface of wafer 4. The image is made of pixels (picture elements) numbered from 1 to 16 in FIG. 2. Graph 9 shows the light intensity distribution just under mask 1. After passing through lens 3, this light distribution is distorted by the limited resolution of the lens (item 3 in FIG. 1). The resulting light distribution is shown in graph 10.

Photoresists are formulated to have a sharp threshold. Once the exposure level crosses the threshold a chemical change occurs. The change is normally a change in the solubility of the resist in a solvent. Because of this sharp threshold a sharp image can be produced in spite of the fact that graph 10 cannot fully reproduce the details of mask 1. As long as all desired features in mask 1 transmit sufficient light to the resist to cause the exposure at corresponding features on the resist to cross the exposure threshold the resist will change to its exposed state and an image will be formed. Line 11 represents the threshold for an exposure of a certain length. FIG. 2 shows the use of a positive resist, which is washed away in all exposed areas. The same theory also applies to negative resists.

The resist becomes exposed in all areas of image 5 where graph 10 crosses threshold 11. In the exposed areas, the resist is washed away from the die. The features of image 5 are imaged sharply, however, their dimensions are distorted. This distortion can be seen by comparing the pattern imaged onto wafer 4 to mask 1 in FIG. 2. For reasons of clarity the pattern imaged onto wafer 4 and mask 1 are shown at the same size, while in most cases the pattern imaged onto wafer 4 is a reduced image. For the same reasons only a one dimensional section is shown, while the same effect is happening in the other dimension as well. All graphs are shown along the X axis (as defined in FIG. 1) but the identical situation also happens in the Y axis. Also, for clarity the fact that the image on wafer 4 may be inverted (depending on the optical system used) is not shown in the graphs.

Because both the optical system and the photoresist behave as linear systems (at least as far as accumulation of exposure is concerned) the principle of linear superposition holds. This principle states that $f(a+b)=f(a)+f(b)$, or the response of the system to a function made up of multiple parts is equal to the sum of the responses of the system to each part when each part is applied separately. This principle is illustrated in FIG. 3. Mask 1 can be separated into two masks, 1A and 1B each one containing only part of the image. In FIG. 3, all the transmissive pixels with an even number are placed on mask 1A, while all the odd-numbered transmissive pixels are on mask 1B. Graphs 9A and 9B generate exposure functions 10A and 10B corresponding to masks 1A and 1B. Because of the principle of linear superposition the exposures on the photoresist layer add up to graph 11, even if exposure 10A and 10B are applied sequentially and at a considerable time delay between exposures. The resultant exposure function 10 and image 5 will be identical to those shown in FIG. 2. In other words, there is nothing to be gained by breaking up the mask into multiple masks if the sum of the images equals the original image.

The difficulty of imaging features having the desired dimensions in a die on wafer 4 can be appreciated from FIG. 3. If exposure is decreased graph 10 will move down relative to threshold 11. Some features will change to become more accurate (for example, pixels 3 and 5) while others will become worse (such as pixel 11). This leaves a very narrow range of exposure, known as a "process window" in which the system can be used. Even at an optimal exposure, isolated clear openings imaged on the resist become too small and wide clear openings imaged on the resist become too wide (for positive resists).

Recently a different type of resist, known as thermoresist, has been used in manufacturing printing plates and printed circuit boards. A thermoresist (also known as a thermal resist or heat-mode resist) changes solubility when a certain temperature, rather than a certain accumulated exposure, has been reached. Such thermoresists can be imaged using near infra-red light and therefore are also known as "IR resists". Some examples of thermoresists are disclosed in the following U.S. Pat. Nos.: 4,619,894 (Bozler); 5,512,418 (Ma); 5,641,608 (Grunwald); 5,182,188 (Cole); and 5,328,811 (Brestel). Thermal resist is also available from Creo Ltd. (Lod Industrial Park, Israel), sold under the trade name "Difine 4LF". All of the above-mentioned thermoresists respond to temperature and do not follow the reciprocity law.

It is not possible to have a practical true thermoresist which follows the reciprocity law. Such a thermoresist would be exposed simply by long exposure to ambient temperature (just as a photoresist will get exposed by a long exposure to ambient light). While it is possible to shield a photoresist from ambient light it is not practical to shield a thermoresist from ambient temperature. Therefore a practical thermoresist cannot obey the reciprocity law. Prolonged exposure to ambient temperatures below the threshold temperature has little effect on a thermoresist. Obviously, the threshold temperature needs to be well above the temperatures expected to be encountered in shipping and storage.

When the chemical reaction in a thermoresist does not have a sharp threshold temperature, the chemical composition is formulated to keep the reaction rate very low at room temperature. This is not difficult to do, as most chemical reaction rates approximately double every 10 degrees centigrade. Thus the reaction rate in a thermoresist exposed at 350 degrees centigrade can be a billion times faster than at 25 degrees. Using lasers it is fairly easy to raise the temperature of a thermoresist to over 1000 degrees. Such a thermoresist will appear to have a distinct threshold simply because the reaction rate at lower temperature slows down exponentially. To follow the reciprocity law the reaction rate would have to change in a linear fashion with temperature.

There is a need for imaging systems which provide increased resolution.

SUMMARY OF THE INVENTION

This invention is enabled because thermoresists violate the reciprocity law. Such thermoresists do not integrate the exposure, and any stray heat dissipates quickly. It is therefore possible to image thermoresists by using multiple exposures without adding up stray light in the areas not being exposed. Separating the image into multiple exposures places fewer demands on the imaging optics since each exposure images a mask which contains fewer than all of the features to be imaged.

This invention provides stepper for imaging integrated circuit and flat panel displays which uses multiple masks, each one containing only part of the features which need to be imaged. The final image is generated by combining the images from all the masks on a single die taking advantage of the fact that thermal resists do not follow the reciprocity law. For maximum resolution each one of the multiple masks preferably contains features of only one size.

BRIEF DESCRIPTION OF DRAWINGS

In figures which illustrate non-limiting embodiments of the invention.

DESCRIPTION

Figure 1:
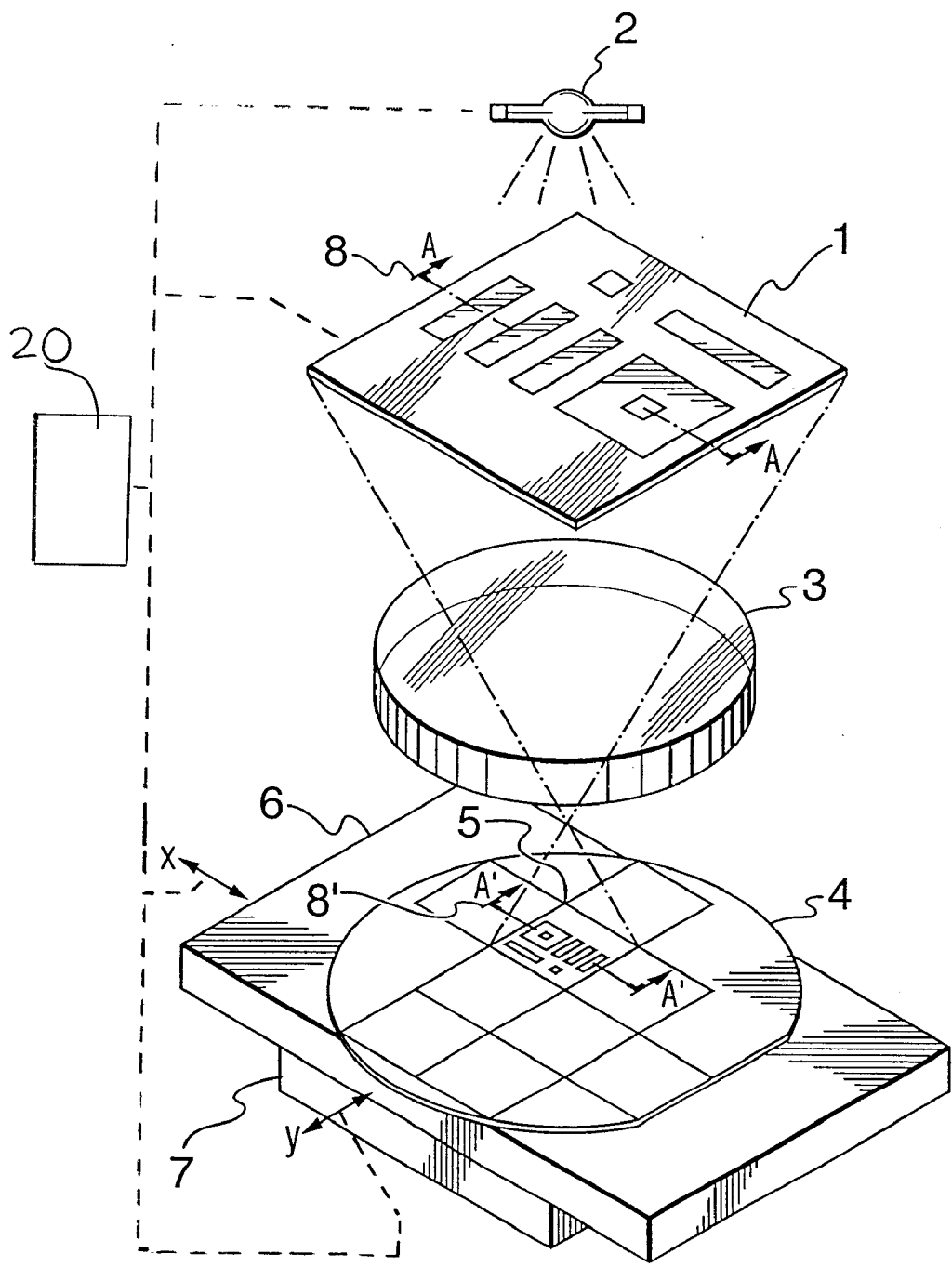
FIG. 1 is an isometric view of a prior art optical stepper.

Referring now to FIG. 1, which shows the key elements of an optical stepper, mask 1 is imaged on die 5 which is part of wafer 4 by lens 3. Lens 3 does not need to consist of a single lens but is any optical system suitable for imaging mask 1 onto die 5. Wafer 4 can be moved in the X direction by mechanical stage 6 and in the Y direction by mechanical stage 7. The operation of the stepper is coordinated by an electronic controller 20. Various details of the optical stepper are omitted as they can be the same in the present invention as in existing steppers.

To practice the invention lamp 2 is replaced by a pulsed UV light source, such as a pulsed xenon lamp. A suitable lamp is model 457A available from Xenon Corporation (Woburn, Mass.). For steppers already using a pulsed light source, such as an excimer laser, no modification of the light source is required except an increase in pulse power of about 2× to 20×, depending on the thermoresist used. The light source is preferably capable of exposing the resist being used in a duration of less than 1 millisecond. The second modification required for the invention is the use of a resist which does not obey the reciprocity law. Preferably the resist is a thermoresist. The third modification is replacing mask 1 by a set of sub-masks 1A, 1B, 1C, 1D, imaged in sequence, each one containing part of the image of mask 1. Preferably the image on mask 1 is separated into multiple sub-masks in a manner which keeps all image elements on each sub-mask the same size. For example if mask 1 is replaced by four sub-masks it is possible to make each one of the sub-masks so that it contains single-size features. All of the features are equal in size to the smallest feature of mask 1.

Figure 2:
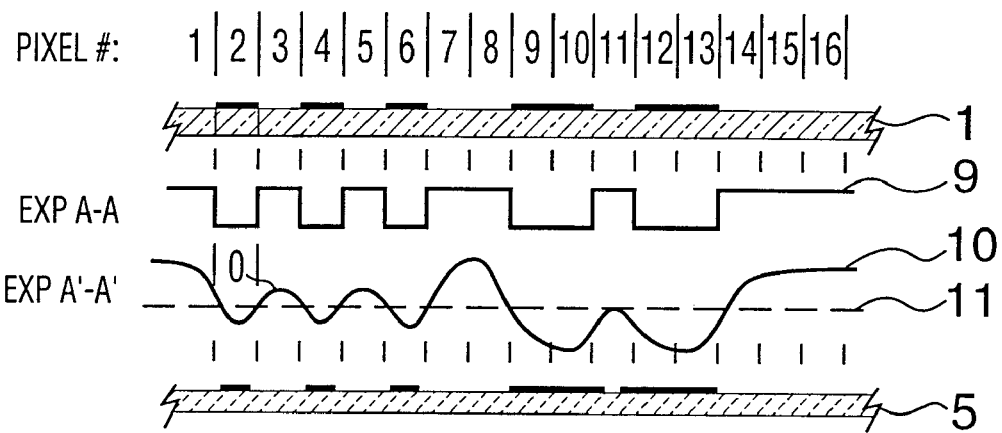
FIG. 2 is a schematic representation of the prior art imaging process in an optical stepper.
Figure 4:
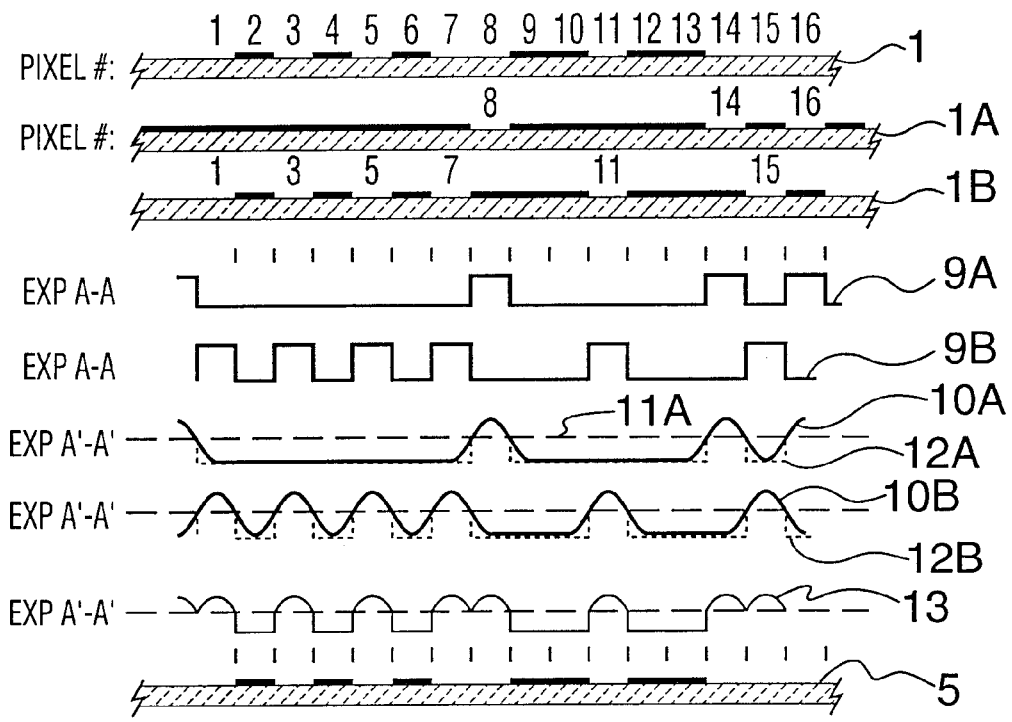
FIG. 4 is a schematic representation of the imaging process according to the invention, showing the improvement possible by separating the mask into multiple masks.

The benefits of using multiple sub-masks instead of a single mask are shown in FIG. 4. Mask 1 contains a series of openings which transmit light. The mask is normally fabricated by etching these openings in chrome-coated glass. The imaged area of mask 1 can generally be divided into an array of pixels. Each pixel can either coincide with an opening or not. The pixels can be identified by numbers. Assuming that the smallest opening is a single pixel (while clearly understanding that the smallest opening can consist of multiple pixels) some openings are located at even numbered pixels while others are located at odd numbered pixels. For example, mask 1 in FIG. 2 has openings at pixel numbers 1, 3, 5, 7, 8, 11, 14, 15, 16. It should be understood that mask 1 is two dimensional and FIG. 4 represents a single section (section A—A along line 8 in FIG. 1) through this mask.

Mask 1 can be replaced by two sub-masks, 1A and 1B, each containing only the even-numbered or odd-numbered openings respectively. The light distribution of sub-mask 1A is shown by graph 9A which is converted to 10A after imaging. Graph 10A represents the exposure at cross section A'—A' along line 8' in FIG. 1. If a thermoresist is used it will undergo a chemical or physical change at all points where exposure 10A exceeds threshold 11 (or, more precisely, the exposure was sufficient to raise the temperature of the resist to a temperature in excess of the threshold temperature for an ideal thermoresist). Obviously, the exposure time needs to be very brief, in the range of nanoseconds to microseconds, to avoid all heat escaping into the substrate. This is the reason for the use of a pulsed light source, unlike the continuous light source used in most optical steppers today. The light source and lens 3 constitute a means for locally heating the resist. All areas heated to temperatures above the threshold exposure will be transformed (for a resist, change their solubility) while all the areas in which exposure (or temperature, for an ideal thermoresist) did not reach threshold will cool down and behave as they were never exposed. This changes exposure graph 10A into an effective exposure graph 12A. The closer the resist is to an ideal thermoresist, the closer the equivalent exposure will be to graph 12A. Sub-mask 1A and lens 3 together constitute a means for illuminating a first set of features on the resist.

Figure 3:
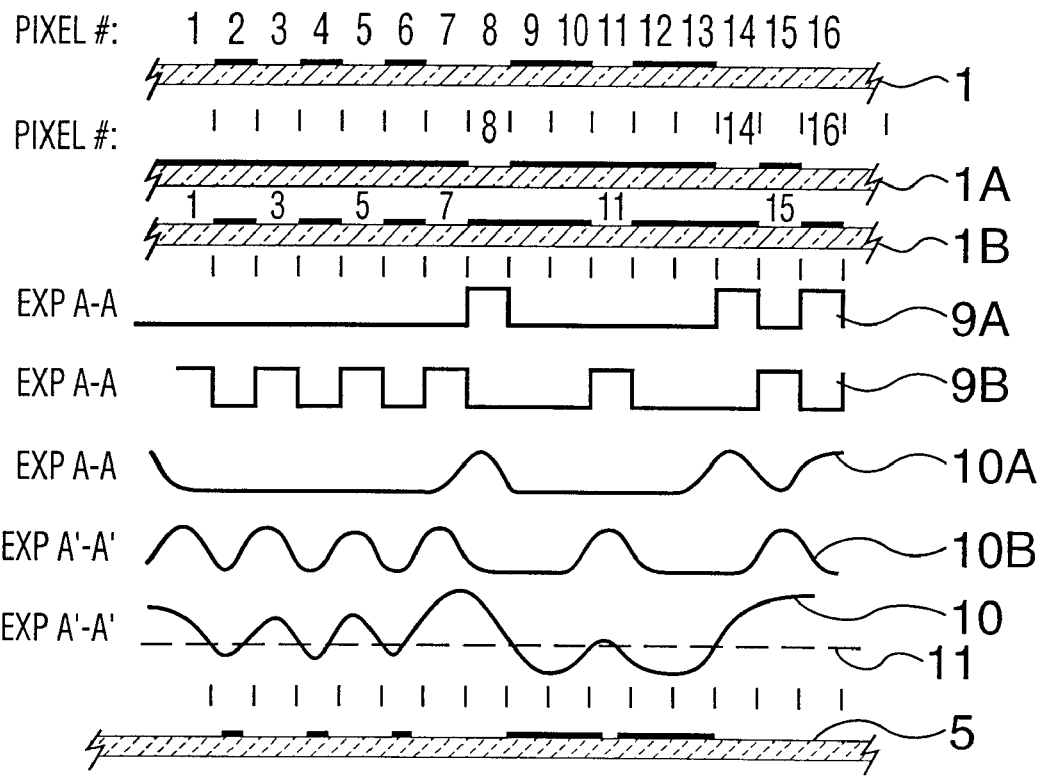
FIG. 3 is a schematic representation of the prior art imaging process in an optical stepper showing the lack of improvement from separating the mask into multiple masks.

Now sub-mask 1A is replaced by sub-mask 1B, containing all the odd numbered openings. This results in exposure function 9B becoming 10B after imaging and 12B after heat has dissipated. Since both 12A and 12B are imaged on same area of die 5 the equivalent exposure will be graph 13, generating correctly sized features on die 5 (compare graph 13 and die 5 in FIG. 4 to graph 10 and die 5 in prior art FIG. 3). Sub-mask 1B and lens 3 together constitute a means of illuminating a second set of features on the resist.

Figure 5:
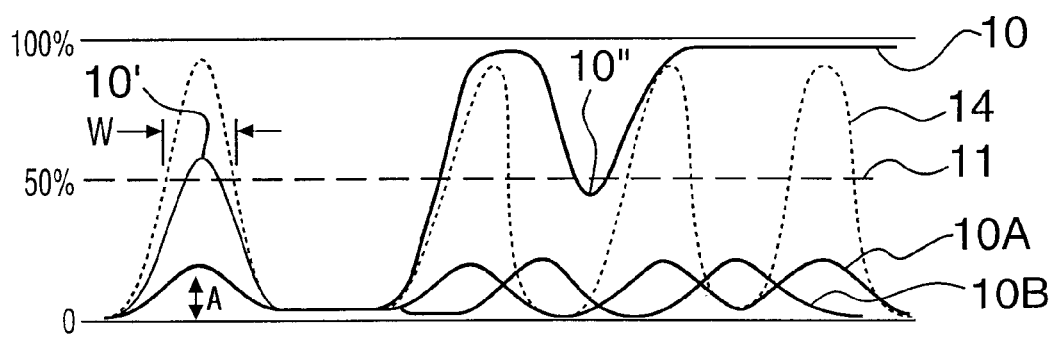
FIG. 5 is a schematic comparison between the prior art imaging process and the process of the invention.

It should be noted that, while graph 13 is equivalent exposure, the image was formed in two steps. The even numbered pixels were fully imaged in the first step, shown by graph 12A, while the odd numbered pixels were imaged separately in the second step, shown by graph 12B. Any stray light (or heat) added by graph 12B to the image formed by 12A has a negligible effect, as any heat below threshold 11 will dissipate rapidly. The thermal time constant of typical thermoresist layers is a few microseconds for a one micron thick resist layer, thus it is sufficient to wait a few microseconds between using sub-mask 1A and sub-mask 1B to make the exposures almost independent of each other. A stepper according to the invention has a controller which includes a timer and is configured to automatically expose a substrate through a first sub-mask and then expose the substrate through subsequent sub-masks while pausing between each exposure for long enough to permit heat from the exposure of the previous sub-mask to substantially dissipate. These functions may be provided for example by the same controller 20 which controls other aspects of the operation of the stepper. The delay between exposing to subsequent sub-masks may also be provided by a separate timer or even by the time taken by the stepper to switch to another sub-mask. The controller or other mechanism which causes a delay between exposing using the different sub-masks may be described as a "means for pausing". The benefit of making the exposures independent is shown in FIG. 5.

In order to image with a prior art stepper the resolution of the lens had to be sufficient to cause the light change caused by the smallest feature to exceed 50% of the light change caused by the largest feature. This is shown by the relationship of graph 10 and threshold 11. In order to resolve the smallest individual opening 10' (transparent feature) the exposure has to exceed the threshold. At the same time overall exposure cannot be increased, otherwise the smallest opaque feature 10" will not be able to reduce the light below the threshold 11. This is also the reason threshold 11 has to be maintained at about the midpoint between the light level generated by the largest opaque area (nearly zero) and the light level generated by the largest clear area (shown as 100% in FIG. 5). Any attempt to improve the reproduction of feature 10' will be at the expense of feature 10".

The problem is completely solved by this invention if the image can be separated into multiple images, each one containing image elements of the same size. If all elements are of the same size and are sufficiently separated, even a response which is a fraction of the 100% level in FIG. 5 can be used by increasing the overall exposure level. If the exposure created by each mask only reaches the level shown as "A" in graph 10A in FIG. 5 (due to limited resolution of the optical system) the total power of lamp 2 in FIG. 1 can be raised until graph 10A is scaled up to graph 14, crossing threshold 11 to generate the correct feature size W. At the second exposure graph 10B is scaled up the same way. The interaction between features 10' and 10" is now minimal for two reasons. First, adjacent features are never imaged at the same time, as, on any one sub-mask, any two features are separated by at least the width of one feature. Secondly, any energy (light or heat) below the threshold is dissipated before any adjacent feature is imaged, minimizing interaction between features as long as a thermoresist is used (or, more generically, a material not obeying the reciprocity law is used).

Figure 6:
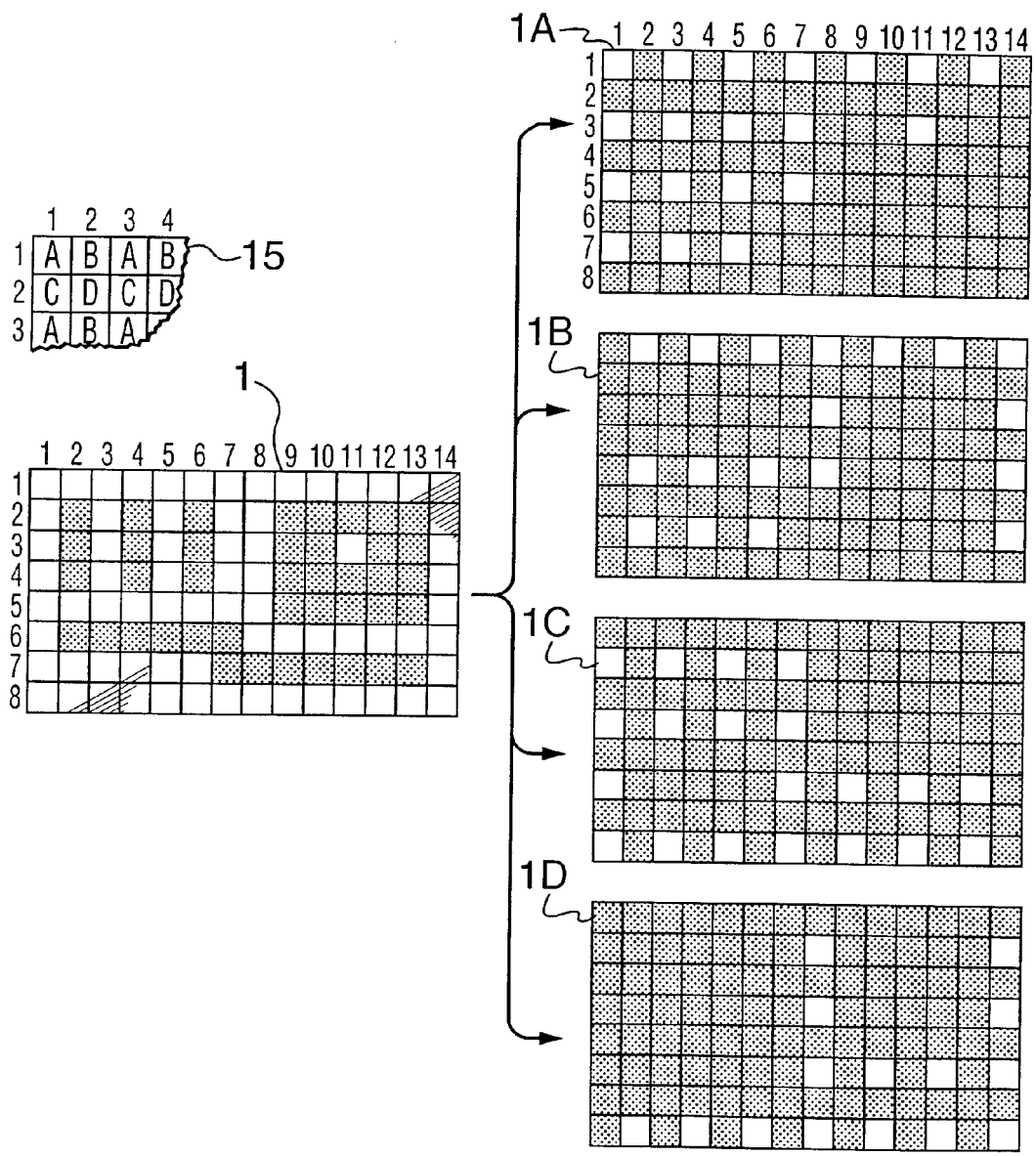
FIG. 6 is an example of separating a mask into multiple masks according to the invention.

In theory response level "A" can be a very small fraction of the response 10' and 10" required from prior art steppers. In practice it is limited by interaction between features. The smaller response "A" is, the further different features on each sub-mask need to be separated to avoid interaction between features exposed simultaneously. This may require replacing one mask by a large number of sub-masks. For example, if features are separated by at least one feature in each direction, four sub-masks are required to replace one mask, as shown in FIG. 6. If the required separation is two features, nine sub-masks will be required to replace one sub-mask, however, the value "A" in FIG. 5 can be lower, offering higher resolution for a given stepper. For a given optical system, the value "A" will decrease as features become smaller. On the other hand, the high density of integrated circuits typically requires the use of the smallest features possible. In this disclosure "feature" refers to the smallest element used in the image. A feature can be a single pixel or a group of pixels. For example, if the mask contains one micron lines generated with a 0.1 micron addressability, a pixel will be 0.1 micron but the smallest feature is one micron.

FIG. 6 shows one example of separating a mask 1 into four sub-masks 1A, 1B, 1C and 1D in order to have all features the same size and separated from each other by at least one feature. Obviously, other schemes of separating an image into images which are easier to reproduce can be used. An alternative method is to image all large features on a single mask, in order to take advantage of the higher light throughput of larger features, and to use separate sets of one or more sub-masks for fine features. In FIG. 6 the image is divided into odd and even rows and columns. Sub-mask 1A contains only the openings which are in odd rows and columns as shown by insert 15. Sub-mask 1B contains odd rows and even columns. Sub-mask 1C contains even rows and odd columns. Sub-mask 1D contains all the openings which were located on even rows and columns. On each sub-mask, each opening lies between two columns which have no openings and between two rows which have no openings.

Needless to say, register must be maintained between the different images, however this is part of the prior art of stepper design. The ability to maintain register between sequential images with different masks is a required feature in all steppers. Since the invention should be used with pulsed light, with pulse duration not exceeding a few microseconds, imaging can be done while the wafer (4 in FIG. 1) is still moving. Pulsed imaging also helps to eliminate the effect of vibrations. For example, for a wafer velocity of 100 mm/sec and an excimer laser pulse of 50 nS the total motion blur is 100 mm/sec×50 nS=5 nm, which is negligible in most applications.

Using this invention at very high resolutions (over two times what can be achieved with photoresists) also requires very thin resists. This is needed to avoid thermal lateral diffusion from reducing resolution. Vertical thermal diffusion does not affect resolution. Thin resists are also more compatible with excimer lasers, which are absorbed strongly in the top layer of thicker resists. The present invention is particularly useful when used with thin thermal resists prepared according to U.S. Pat. No. 4,619,894, which is hereby incorporated in this disclosure by reference.

While the preferred embodiments show a "stepper" type imaging system the invention should be interpreted in a broader sense to all imaging applications using an optical system to transfer an image from a master, or mask, to a substrate, by using a coating on the substrate not following the linear superposition principle and by separating the image of the mask into multiple sub-masks. Also while the mask is normally a non-alterable image it is obvious that an electronically alterable mask such as a two dimensional light valve can be substituted for a fixed mask. The advantage of an electronically alterable mask is that it is easier to separate the image into a large number of images. Another obvious variation is to use a rapidly scanning light spot or line also known as "flying spot scanner" on the mask in order to create a very short exposure for each feature instead of pulsing the light source. This embodiment is particularly useful when using CW UV lasers, such as a frequency quadrupled YAG laser operating at 266 nm. The spot size of such a laser can be larger than the feature size being imaged.

Figure 7:
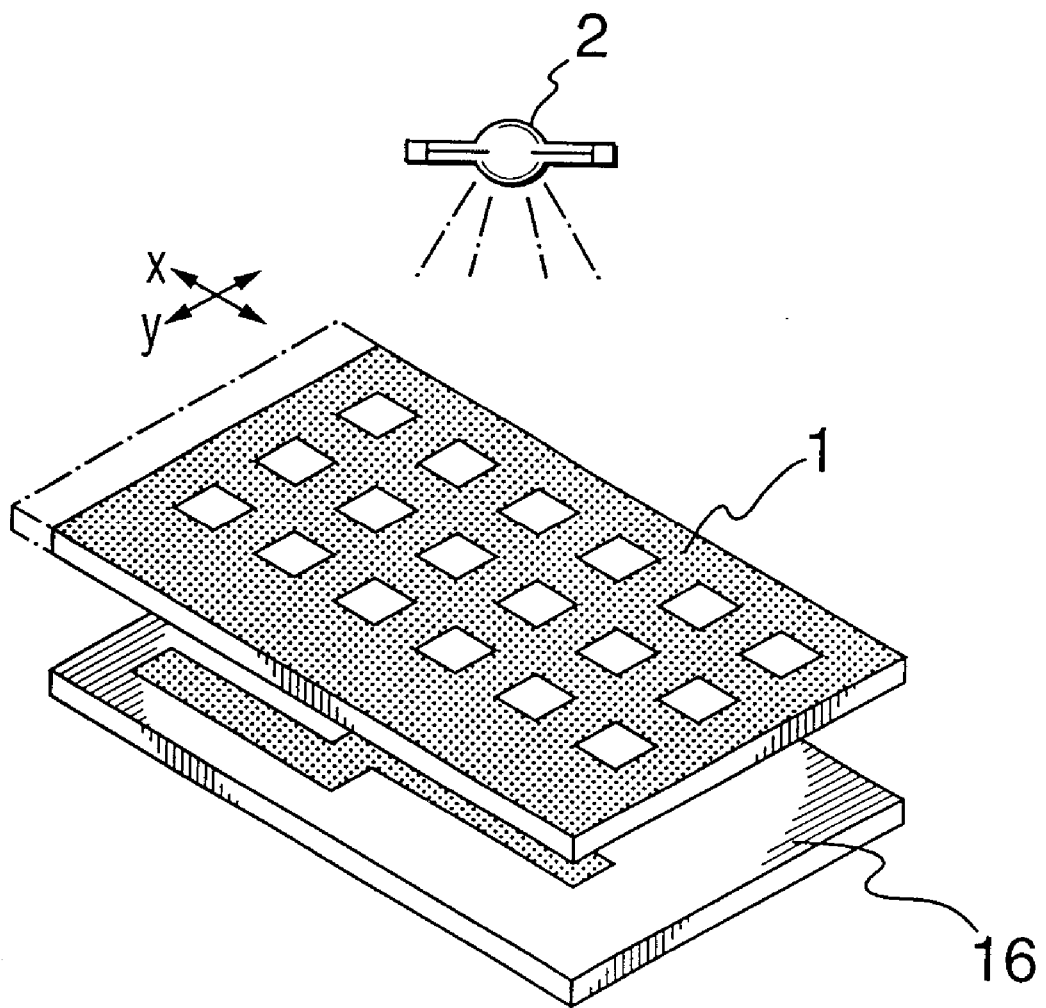
FIG. 7 is an alternate method of separating the mask into multiple masks.

An alternative to separating the mask into multiple masks is shown in FIG. 7 in which only one mask is used but a separate illumination mask 17 is moved over mask 16 in steps of one pixel (or the smallest feature) and exposed multiple times in order to separate image 1 into multiple images similar to the images 1A, 1B, 1C and 1D in FIG. 6. A suitable x-y positioning system is provided to move illumination mask 17 relative to mask 16. This x-y positioning system may be called a "means for translating the illumination mask". Any combination of masks, illumination mask and scanning spot or line illumination of a mask in conjunction with a coating not obeying the linear superposition law (or reciprocity law, which is closely related) should be understood to be covered by this disclosure. Because of linear superposition, all these methods do not improve the performance of the imaging system unless they use a resist (or other coating) which does not obey the law of reciprocity.

The fact that any exposure of a thermoresist below the threshold value will dissipate as stray heat also allows the invention to correct for small deviations in flatness in the die as well as other focus errors. Any area of the image which is out of focus will not image at all, as graph 14 in FIG. 5 will become flattened and not cross the threshold. These areas can be re-imaged at a different focus setting, for example by vertically moving lens 3 in FIG. 1 in small increments. In conventional imaging any out-of-focus area cannot be re-imaged as the new exposure will combine with the out-of-focus exposure. This ability to expose each area multiple times, each exposure at a slightly different focus, overcomes the very low depth of focus (about 1 micron) of modern optical steppers.

Figure 8:
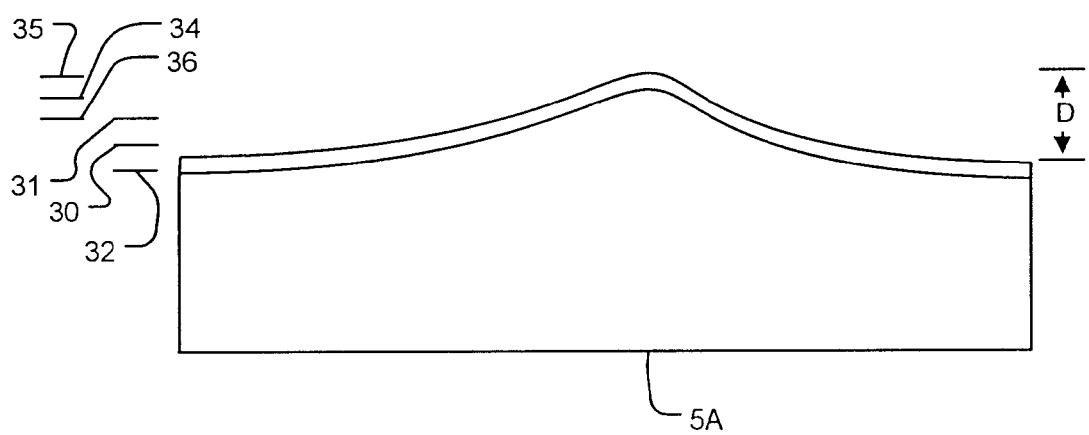
FIG. 8 is a schematic illustration showing a resist on a non-planar surface being exposed according to the invention.

FIG. 8 shows a die 5A having a non-planar surface coated with a resist. The relief in the surface of die 5A, which is indicated by dimension D, is greater than the depth of focus of an optical system being used to image the resist. Imaging may be performed by setting the optical system at a first focus setting indicated by line 30 so that portions of the resist within a depth of field of the optical system between lines 31 and 32 will become properly exposed. Subsequently, the focus of the optical system can be changed to a different focus setting. For example, the optical system may be focused on line 34. When an exposure is taken with the optical system focused on line 34, all portions of the resist within the depth of field of the optical system between lines 35 and 36 will become properly exposed.

An optical stepper according to the invention may have an automatic controller for making multiple exposures at slightly different focus settings, the exposures separated sufficiently in time to permit stray heat to dissipate between exposures. These functions may be provided, for example, by controller 20.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. Apparatus for providing an imagewise exposed resist on a surface, the apparatus comprising:
    a) a light source and a surface coated with a resist, the resist convertible from an unexposed state to an exposed state by exposure to radiation from the light source, the resist having a non-linear exposure function;
    b) an image to be exposed on the resist, the image comprising a plurality of features, the features comprising features in a first set of features and features in a second set of features;
    c) means for illuminating the first set of features with light from the light source to image the first set of features onto the resist without converting the resist to the exposed state in areas corresponding to the second set of features; and,
    d) means for subsequently illuminating the second set of features with light from the light source to image the second set of features onto the resist.

2. The apparatus of claim 1 wherein the resist comprises a thermoresist.

3. The apparatus of claim 2 comprising means for pausing for a time in excess of a thermal time constant of the thermoresist between illuminating the first set of features and illuminating the second set of features.

4. The apparatus of claim 3 wherein the light source comprises a pulsed arc lamp and the means for illuminating the first and second sets of features comprise means for illuminating the first and second sets of features with pulses of light from the arc lamp.

5. The apparatus of claim 3 wherein the light source comprises a pulsed excimer laser and the means for illuminating the first and second sets of features comprise means for illuminating the first and second sets of features with pulses of light from the excimer laser.

6. The apparatus of claim 1 wherein the means for exposing the first set of features comprises means for placing a first mask in an optical path between the light source and the resist and the means for exposing the second set of features comprises means for placing a second mask in the optical path between the light source and the resist.

7. The apparatus of claim 1 wherein the first and second sets of features are both defined by a mask in an optical path between the light source and the surface; the means for illuminating the first set of features comprises an illumination mask in a first position in an optical path between the light source and the surface; and, the means for illuminating the second set of features comprises the illumination mask in a second position translated relative to the first position in the optical path.

8. The apparatus of claim 1 wherein all of the features in the first set of features are equal in size.

9. The apparatus of claim 8 wherein all of the features in the second set of features are equal in size to all of the features in the first set of features.

10. The apparatus of claim 1 wherein all of the features are substantially rectangular.

11. The apparatus of claim 1 wherein all of the features are larger than a minimum size, all features in the first set of features are spaced apart from other features in the first set of features by at least the minimum size and all features in the second set of features are spaced apart from other features in the second set of features by at least the minimum size.

12. The apparatus of claim 1 comprising a mask which includes the first and second sets of features, and an illumination mask comprising an array of spaced apart features, the mask and illumination mask together permitting the light source to illuminate the surface at locations where a feature of the mask coincides with a feature of the illumination mask, wherein the means for illuminating the first set of features illuminates the first set of features when the illumination mask is in a first registration relative to the mask and the means for subsequently illuminating the second set of features illuminates the second set of features when the illumination mask is in a second registration relative to the mask.

13. The apparatus of claim 12 wherein the light source comprises a pulsed light source, the means for illuminating the first set of features comprises means for pulsing the light source a first time and the means for subsequently illuminating the second set of features comprises means for pulsing the light source a second time.

14. The apparatus of claim 12 wherein the features of the illumination mask are equal in size to one another and are spaced apart from other features by a distance at least equal to a dimension of the features.

15. The apparatus of claim 1 wherein the means for illuminating the first set of features with the light source comprises a first sub-mask interposed between the light source and the surface and the means for subsequently illuminating the second set of features with the light source comprises a second sub-mask interposed between the light source and the surface.

16. The apparatus of claim 1 wherein the means for exposing the first set of features comprises a light valve having an array of addressable elements, a controller adapted to turn on elements corresponding to the first set of features.

17. The apparatus of claim 16 wherein the means for exposing the second set of features comprises the controller adapted to turn on elements corresponding to the second set of features.

18. An apparatus for providing an imagewise exposed resist on a surface, the apparatus comprising:
 a) a light source and a surface coated with a resist, the resist convertible from an unexposed state to an exposed state by exposure to radiation from the light source, the resist having a substantially non-integrating exposure function;
 b) a plurality of sub-masks, each of the sub-masks defining a set of features for imaging on the substrate;
 c) means for sequentially imaging each of the sets of features on the resist by interposing each of the sub-masks in register in an optical path between the light source and the resist and illuminating the surface with the light source to convert areas of the resist corresponding to the set of features from the unexposed state to the exposed state; and,
 d) means for pausing for a period at least equal to a thermal time constant of the resist between imaging each of the sets of features.

19. The apparatus of claim 18 wherein the resist is a thermoresist and the means for sequentially imaging each of the sets of features comprises means for locally heating the resist to a temperature in excess of a threshold temperature.

20. The apparatus of claim 19 wherein all of the features on each one of the sub-masks are the same size.

21. The apparatus of claim 19 comprising four sub-masks wherein the features on each of the sub-masks are the same size and are separated from other features on the sub-mask by a distance of at least one feature size.

22. The apparatus of claim 19 wherein the features of each of the sub-masks comprise light-passing cells arranged in a regular array comprising rows and columns of equal-sized cells, the cells comprising light-blocking cells and light-passing cells, wherein each feature of the sub-mask is between adjacent columns of light-blocking cells and adjacent rows of light-blocking cells.

23. The apparatus of claim 19 for imaging an image having features arranged in an array comprising a plurality of rows and columns, the columns comprising interleaved odd and even columns and the rows comprising interleaved odd and even rows, wherein a first sub-mask comprises features in odd rows and odd columns, a second sub-mask comprises features in odd rows and even columns, a third sub-mask comprises features in even rows and odd columns, and a fourth sub-mask comprises features in even rows and even columns.

24. The apparatus of claim 23 wherein the means for locally heating the resist comprises a laser and means for scanning the laser over one of the sub-masks.

25. The apparatus of claim 18 wherein the surface is non-planar and the means for sequentially imaging each set of features comprises means for illuminating the sub-mask with the light source, a variable focus optical system and means for imaging the illuminated sub-mask onto the resist a plurality of times with the optical system at a different focus setting each time.

26. Apparatus for providing an imagewise exposed resist on a surface, the apparatus comprising:
 a) a light source and a surface coated with a resist, the resist convertible from an unexposed state to an exposed state by exposure to radiation from the light source, the resist having a substantially non-integrating exposure function;
 b) an image mask defining features to be imaged on the substrate;
 c) an illumination mask comprising an array of spaced apart light passing areas; and,
 d) means for sequentially imaging a plurality of sets of the features on the resist by:
  placing the image mask and the illumination mask in an optical path extending between the light source and the surface;
  exposing the surface with light from the light source which is passed both by the mask and by the illumination mask to image a set of features on the surface;
  translating the illumination mask; and,
  exposing the surface with light from the light source which is passed both by the mask and by the illumination mask in its translated position to image another set of features on the surface.

27. The apparatus of claim 26 wherein the resist is a thermal resist.

28. The apparatus of claim 26 comprising means for pausing for a period at least equal to a thermal time constant of the resist between imaging each of the sets of features.

29. The apparatus of claim 26 wherein the means for translating the illumination mask comprises means for translating the illumination mask in each of two dimensions.

30. The apparatus of claim 29 wherein each of the features comprises a single pixel.

31. The apparatus of claim 30 wherein the illumination mask comprises a regular two-dimensional array of equal-sized rectangular light passing areas spaced apart by a distance equal to twice a width of each light passing area.

32. The apparatus of claim 31 wherein the light passing areas are square.

* * * * *